United States Patent [19]

Linvill

[11] Patent Number: 4,491,760
[45] Date of Patent: Jan. 1, 1985

[54] FORCE SENSING POLYMER PIEZOELECTRIC TRANSDUCER ARRAY

[75] Inventor: John G. Linvill, Portola Valley, Calif.

[73] Assignee: Stanford University, Stanford, Calif.

[21] Appl. No.: 480,025

[22] Filed: Mar. 29, 1983

Related U.S. Application Data

[63] Continuation-in-part of Ser. No. 312,094, Oct. 16, 1981, Pat. No. 4,379,697.

[51] Int. Cl.³ ............................................. H01L 41/08
[52] U.S. Cl. .................................... 310/334; 310/338; 310/331; 310/800
[58] Field of Search ................. 310/328, 339, 330–332, 310/800, 338; 434/114

[56] References Cited

U.S. PATENT DOCUMENTS

| 3,229,387 | 1/1966 | Linvill | 434/114 |
|---|---|---|---|
| 4,051,397 | 9/1977 | Taylor | 310/800 X |
| 4,071,785 | 1/1978 | Yoshida et al. | 310/800 X |
| 4,166,229 | 8/1979 | De Reggi et al. | 310/800 X |
| 4,234,245 | 11/1980 | Toda | 310/800 X |
| 4,379,697 | 4/1983 | Linvill | 434/114 |
| 4,394,773 | 7/1983 | Ruell | 310/800 X |
| 4,406,323 | 9/1983 | Edelman | 310/800 X |

FOREIGN PATENT DOCUMENTS 3017986  11/1981  Fed. Rep. of Germany ...... 310/800

*Primary Examiner*—Mark O. Budd
*Attorney, Agent, or Firm*—Limbach, Limbach & Sutton

[57] ABSTRACT

An electromechanical transducer for the generation of an electric signal in response to a force or motion applied to the tactile surface thereof. The electromechanical transducer comprises a stack of planar sheets of a piezoelectric polymer material, each sheet having two opposed broad flat faces and at least one tactile surface at one longitudinal end, separate electrodes covering portions of each flat face of the sheets in predetermined patterns, terminals electrically connected to said electrodes for passage of said electric signal and means for detecting and amplifying the electric signal generated in response to a force or motion applied to the tactile surface of the transducer.

7 Claims, 6 Drawing Figures

FORCE SENSING POLYMER PIEZOELECTRIC TRANSDUCER ARRAY

RELATED APPLICATION

The present application is a continuation-in-part of U.S. Application Ser. No. 312,094, filed on Oct. 16, 1981, now U.S. Pat. No. 4,379,697 issued Apr. 12, 1983,

TECHNICAL FIELD OF INVENTION

An electromechanical transducer element is disclosed which possesses mechanical and electrical ports coupled by the piezoelectric properties of a layered material located between electrodes. In parent U.S. Application Ser. No. 312,094, a stimulator array was presented whereby upon the application of a stimulating voltage, a piezoelectric material could be caused to longitudinally extend. The particular configuration disclosed in that application was taught to be uniquely adapted to amplify the output of a photoscanning diode, which moved across written text, as an aid to the blind. It has now been determined that a transducer having similar structure could be employed as a means of generating an electric signal in response to a force or motion applied to the tactile surface of the transducer. Such a device could be employed, for example, as a means of sensing force or motion at the extremity of a robotic arm.

BACKGROUND OF THE INVENTION

Several years ago, the present inventor devised an optical to tactile converter device to allow blind people to "read". This device converted printed or other optical text or material directly into a corresponding tactile image by means of an input silicon photo-camera, which sensed the input image and produced a corresponding pattern of output signals which operated an electromechanical tactile stimulator. In the original device, the tactile stimulator was comprised of ceramic bimorphs, which vibrate pins in a two-dimensional array to produce the output tactile image.

As an improvement over the above device, the present inventor devised a tactile stimulator of improved design comprising a stack of sheets of piezoelectric polymer material, which, in the preferred embodiment, is polyvinylidenefluoride ($PVF_2$), with each sheet having two opposed broad flat faces and at least one tactile surface at one longitudinal end. It was determined that upon the application of a voltage of a predetermined magnitude and polarity from an external source applied across the electrodes sandwiching said sheet material, the sheets longitudinally extend their tactile surfaces. By proper employment of the above-described physical structure, selective areas of the tactile surface of the stack of planar sheets could be extended, thus providing a tactual reading source for the blind.

It has now been described that similar technology could be used as a means of sensing force or motion by using the same sheet material in conjunction with an electrode pattern to generate an electric signal in response to a force or motion. It was determined that such a device, when placed, for example, at the "fingertips" of a robotic arm, would provide a sensitivity much greater than that previously realized by the prior art. In fact, it was determined that not only could one "sense" that the device had contacted a foreign object but even the shape and size of the sensed object could be determined.

SUMMARY OF THE INVENTION

The present invention deals with an electromechanical transducer for the generation of an electric signal in response to a force or motion applied to the tactile surface thereof. In its broadest terms, the invention comprises a stack of planar sheets of a piezoelectric polymer material, preferably polyvinylidenefluoride, each sheet having two opposed broad flat faces and at least one tactile surface at one longitudinal end thereof. Separate electrodes are provided covering portions of each flat face of the sheets in predetermined patterns with terminals electrically connected to the electrodes for passage of an electric signal. Finally, means are provided for detecting and amplifying the electrical signal generated in response to the force or motion applied to the tactile surface of the transducer.

It is understood that the tactile surface employed to sense the force or motion applied thereto can be configured as "finely" or as "coarsely" as the physical environment governing its intended use dictates. For example, the electromechanical transducer can be provided with means for connecting the corresponding electrodes of a plurality of sheets in common such that the sheet portions between electrodes will respond as a group to an applied force or motion. The electrodes which are connected in common can be separated from adjacent electrodes on the same sheets of the piezoelectric polymer material by providing a pattern of cuts through the piezoelectric polymer material which outline the electrodes such that a force or motion applied to one area of the tactile surface of the electromechanical transducer will result in the generation of an electric signal substantially only across those electrodes commonly connected to that portion of the polymer material subjected to the force or motion.

Because the electrode patterns can be produced by well-known photochemical processes of the type used in the semiconductor industry and because the perforations or slits can be produced by laser cutting, the electromechanical transducer array can be easily and cheaply fabricated.

The foregoing features and advantages of this invention will be more readily understood upon consideration of the following detailed description of its preferred embodiment, when taken in conjunction with the accompanying drawings.

DETAILED DESCRIPTION OF THE PREFERRED EMBODIMENT

Figure 1:
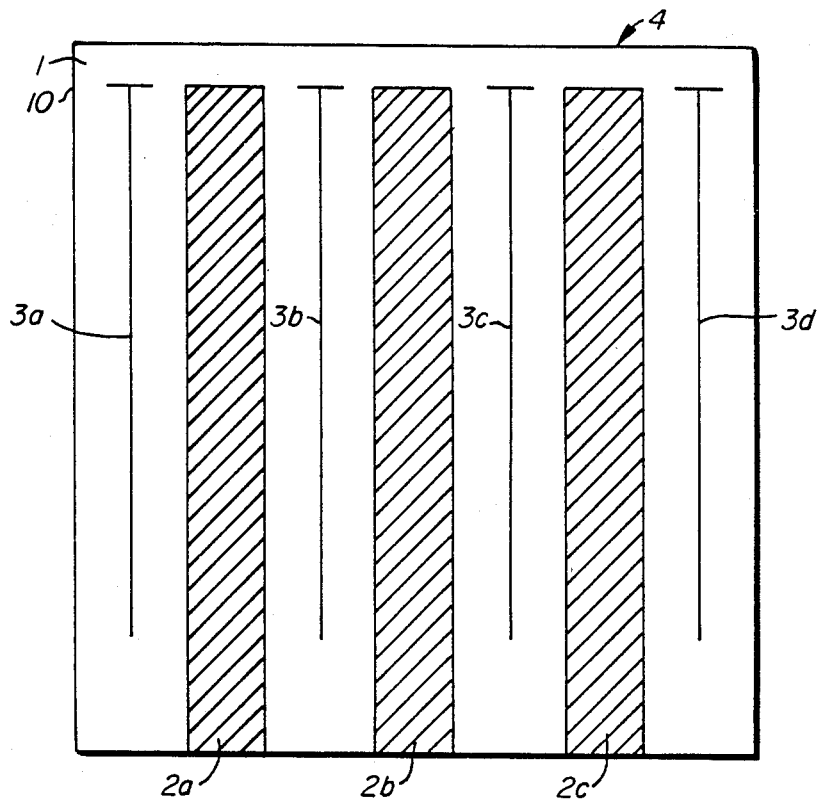
FIG. 1 is a plan view of one of the layers of a piezoelectric sheet material showing the electrode pattern and laser cuts imposed thereon for use in the present invention.

Referring now to the figures, sheet 10 comprises a piezoelectric polymer 1, preferably polyvinylidenefluoride (PVF$_2$). The sheet has planar surfaces which are provided with electrodes 2a, 2b and 2c on one side thereof and corresponding ground electrodes 5a, 5b and 5c, which are deposited on the opposite face and connected by a common ground lead 6. These electrodes could be made of nickel or chromium, for example, by using standard photoresist techniques, well known in the semiconductor industry.

The electromechanical transducer, in effect, possesses a mechanical port and an electrical port which are coupled by the piezoelectric properties of sheet 1. As such, when a force or motion is applied to tactile surface 4 between electrodes shown in FIGS. 1 and 2, preferably in the form of longitudinally extending strips, an electrical output can be drawn from said electrodes as a measure of said force or motion. In order to allow one pair of electrodes such as 2a–5c to respond to a force or motion applied at tactile surface 4, cuts 3a, 3b, 3c and 3d are made on each side of the various electrodes by means of a directed laser beam. It is to be noted that the laser cuts are not configured entirely to tactile surface 4 but, instead, a small portion of sheet material 1 is left uncut, on the order of one-tenth of the electrode width, to allow the sheet material between electrodes to be retained in position without unduly restraining its ability to respond to an external force.

Figure 2:
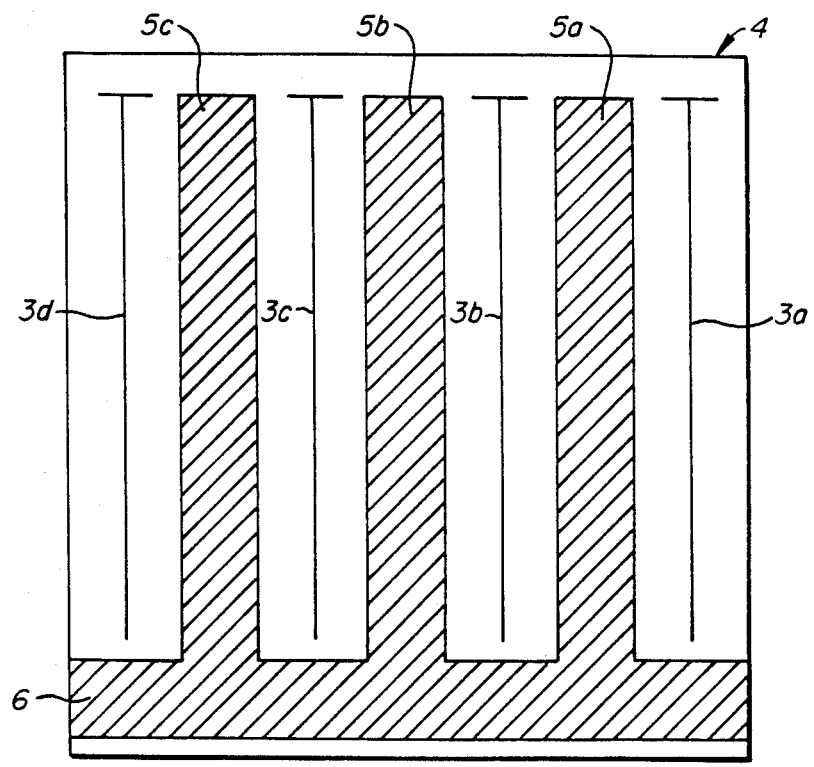
FIG. 2 is a plan view of the back side of the sheet of FIG. 1 showing corresponding "ground" electrodes.
Figure 5:
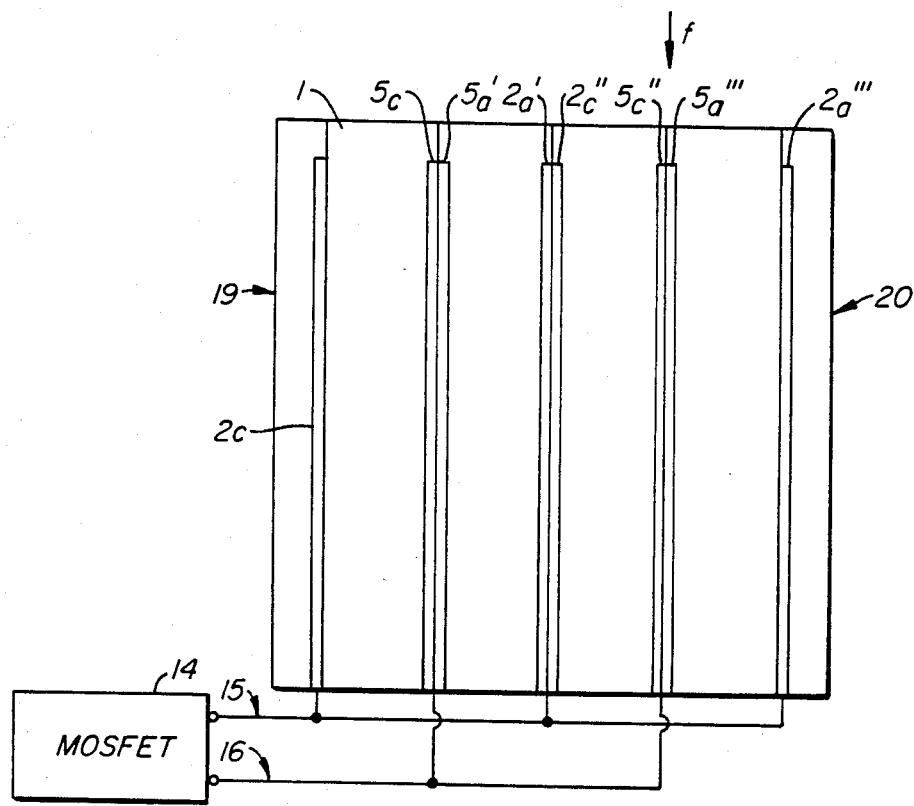
FIG. 5 is a side view of an electromechanical transducer whereby separate elements thereof are connected in parallel.

A mechanical transducer 30 (FIG. 6) can be made by stacking pairs of sheets 10 together. If, for example, the sheets depicted in FIGS. 1 and 2 are stacked such that the electrode pattern of FIG. 1 is contacted with the corresponding identical pattern of an adjacent sheet while the ground electrode pattern of FIG. 2 is similarly caused to abut the ground electrodes of an adjacent sheet, a parallel connection is achieved as shown in FIG. 5. In such a configuration, insulating spacer sheets 19 and 20 fabricated of, for example, Teflon (polyetrafluoroethylene) define the boundaries of the electromechanical transducer element. In this embodiment, piezoelectric sheets 1 are shown sandwiched at their outer extremities by electrodes 2a and 2a''', while ground electrodes 5c, 5a' and 5a'' and 5c''' are shown in an abutting relationship as are electrodes 2a' and 2c''. Sensing amplifier 14 such as a MOSFET device can then be connected by parallel connections 15 and 16.

Figure 3:
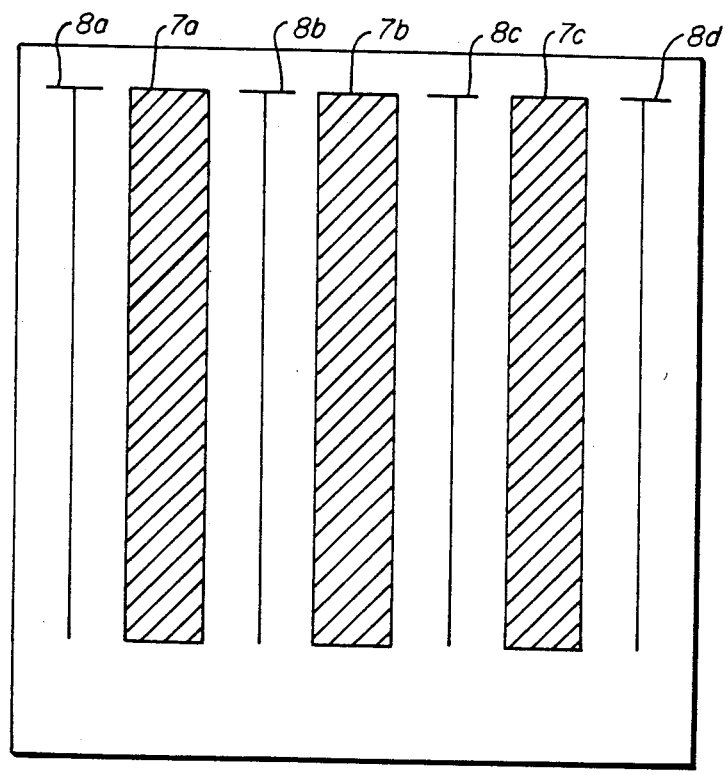
FIG. 3 is a plan view similar to FIG. 1 depicting an alternative electrode configuration.
Figure 4:
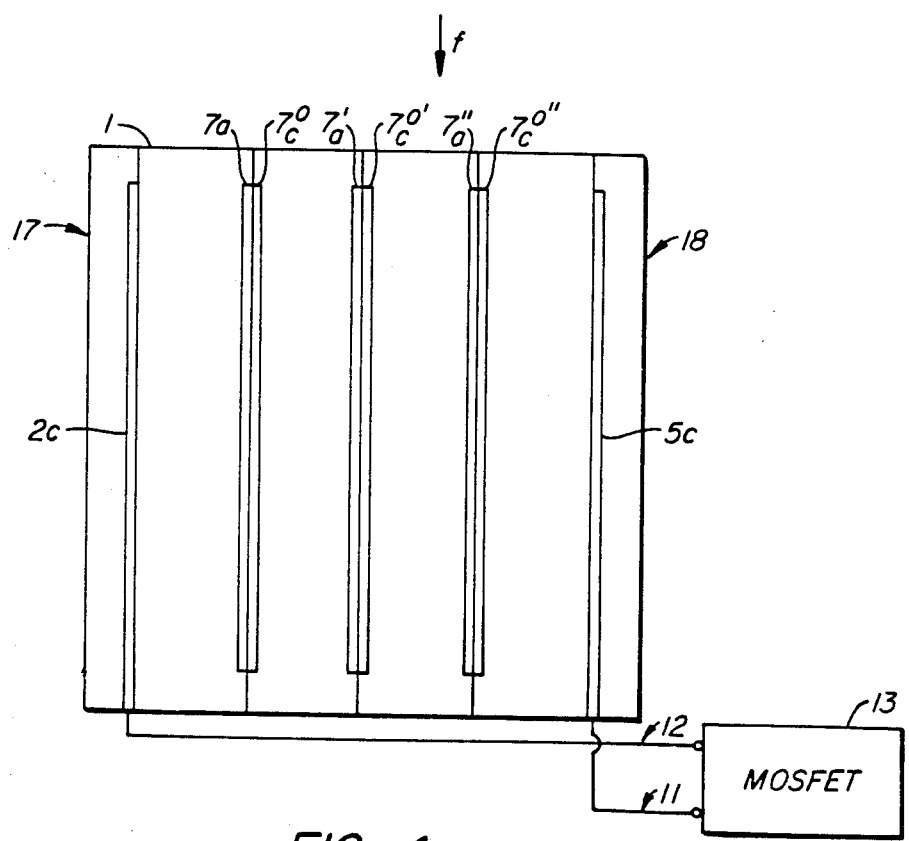
FIG. 4 is a side view of an electromechanical transducer of the present invention whereby individual layers are connected in series.

By contrast, the electromechanical transducer can also be fabricated by electrically connecting individual sheets in series. As illustrative, reference is made to FIGS. 3 and 4 wherein electrical connections 11 and 12 to MOSFET device 13 are made only at outer electrodes 2c and 5a configured in a manner illustrated in FIGS. 1 and 2. The inner elements are prepared as illustrated in FIG. 3 wherein electrodes 7a, 7b and 7c, which do not extend to the bottom surface of the piezoelectric sheet material, are separated by cuts 8a, 8b, 8c and 8d. FIG. 4 illustrates the series connection whereby outer electrodes 2c and 5a sandwich the piezoelectric sheets wherein electrodes 7a and 7c°; 7a' and 7c°'; and 7a'' and 7c°''' are caused to abut each other completing the transducer element. As in the parallel configuration depicted in FIG. 5, this individual element is spaced from corresponding transducer elements by spacers 17 and 18, preferably coextensive Teflon sheeting material, to provide the proper dimensional spacing between transducer surfaces.

Figure 6:
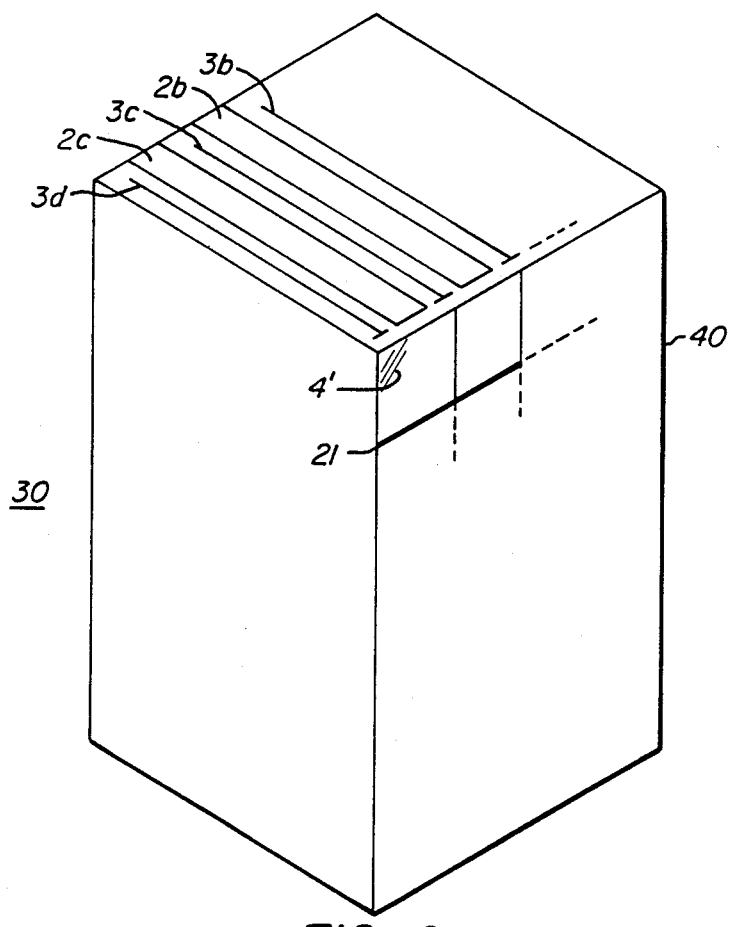
FIG. 6 is an isometric prospective showing the electromechanical transducer of the present invention in a three-dimensional array.

An electromechanical transducer array 30 is made by stacking sheets 10 together, such as shown in FIGS. 4 and 5, as depicted in FIG. 6. When so assembled, tactile surface 4' forms a two-dimensional force and motion sensitive element separated from adjacent elements by spacer 21. When used in a robotic "fingertip", an array of such sensors can generate electrical signals from which can be inferred the shape or orientation of the object being grasped by the robotic element. The number of elements taken along edge 40 determines the total voltage output if connected in series a total current if connected in parallel. PVF$_2$ behaves linearly at very high field strengths (up to 30 V/$\mu$m) so that the use of thin sheets having electrodes connected in parallel results in a lower voltage and increased current being fed to the amplifier circuit.

The piezoelectric material is ordinarily fabricated in thin sheets from 8 to 50 $\mu$m in thickness. Accordingly, most structures of the nature of columns are laminated usually from such sheets approximately 5 cm long. Regardless of the chosen physical dimensions, it is known that the energy available to the input capacitance of the sensing amplifier is proportional to the volume of the piezoelectric element. The capacitance of the element should thus be chosen approximately to match that of the sense amplifier by paralleling groups of laminates with each group being a set of laminates connected as described above.

The electrodes are typically approximately 1 mm wide spaced approximately 2.5 mm apart. The cuts between electrodes can be made with a 20 W CO$_2$ laser producing cut width of approximately 40 $\mu$m.

It will be recognized that the specific forms of the invention herein illustrated and described are intended to be representative only, and certain changes may be made therein without departing from the clear teachings of the disclosure. Accordingly, reference should be made to the following appended claims in determining the full scope of the invention.

I claim:

1. An electromechanical transducer for the generation of an electric signal in response to a force or motion applied to the tactile surface thereof comprising:

a stack of planar sheets of a piezoelectric polymer material, each sheet having two opposed broad flat faces and at least one tactile surface at one longitudinal end;

separate electrodes covering portions of each flat face of the sheets in predetermined patterns;

terminals electrically connected to said electrodes for passage of said electric signal;

means for detecting and amplifying the electric signal generated in response to a force or motion applied to the tactile surface of the transducer; and means for connecting the corresponding electrodes of a plurality of the sheets in common, such that the sheet portions between the electrodes will respond as a group to an applied force or motion and wherein said electrodes which are connected in common are separated from adjacent electrodes on the same sheet of the piezoelectric polymer material by providing a pattern of cuts through the piezoelectric polymer material which outline the electrodes such that a force or motion applied to one area of the tactile surface of the electromechanical transducer will result in a generation of an electrical signal substantially only across those electrodes commonly connected to that portion of the piezoelectric polymer material subjected to the force or motion.

2. The electromechanical transducer of claim 1 further comprising means to electrically insulate the plurality of sheet material and electrodes connected in common from adjacent sheet material and electrodes not so connected.

3. The electromechanical transducer of claim 2 wherein said insulation means comprises sheets of polytetrafluoroethylene.

4. The electromechanical transducer of claim 1 wherein the piezoelectric sheet material is polyvinylidenefluoride.

5. The electromechanical transducer of claim 1 wherein said means of detecting and amplifying the electric signal is a MOSFET.

6. The electromechanical transducer of claim 1 wherein said electrodes which are connected in common are so connected in series.

7. The electromechanical transducer of claim 1 wherein said electrodes which are connected in common are so connected in parallel.

* * * * *